United States Patent
Chen et al.

(10) Patent No.: US 6,861,376 B1
(45) Date of Patent: Mar. 1, 2005

(54) PHOTORESIST SCUM FREE PROCESS FOR VIA FIRST DUAL DAMASCENE PROCESS

(75) Inventors: Dian-Hau Chen, Hsinchu (TW); Ruei-Je Shiu, Tainan (TW); Juei-Kuo Wu, Hsinchu (TW)

(73) Assignee: Taiwan Semiconductor Manufacturing Co., Hsin-Chu (TW)

( * ) Notice: Subject to any disclaimer, the term of this patent is extended or adjusted under 35 U.S.C. 154(b) by 0 days.

(21) Appl. No.: 10/268,587

(22) Filed: Oct. 10, 2002

(51) Int. Cl.[7] .................. H01L 21/31; H01L 21/302; H01L 21/4763
(52) U.S. Cl. .................. 438/781; 438/638; 438/687; 438/725
(58) Field of Search .................. 438/637–640, 438/725, 687, 780, 781, 795

(56) References Cited

U.S. PATENT DOCUMENTS

| | | | |
|---|---|---|---|
| 5,445,979 A | * 8/1995 | Hirano | 438/167 |
| 5,933,761 A | 8/1999 | Lee | 438/783 |
| 6,156,640 A | 12/2000 | Tsai et al. | 438/636 |
| 6,211,068 B1 | 4/2001 | Huang | 438/634 |
| 6,319,815 B1 | * 11/2001 | Iguchi et al. | 438/624 |
| 6,319,820 B1 | 11/2001 | Liu | 438/633 |
| 6,406,995 B1 | * 6/2002 | Hussein et al. | 438/638 |
| 6,432,811 B1 | * 8/2002 | Wong | 438/619 |
| 6,569,777 B1 | * 5/2003 | Hsu et al. | 438/725 |

* cited by examiner

*Primary Examiner*—Ha Tran Nguyen
(74) *Attorney, Agent, or Firm*—Duane Morris LLP

(57) ABSTRACT

An improved method of forming a dual damascene structure by a via first process is described. Via holes are formed in a damascene stack consisting of an etch stop layer, a dielectric layer, and a barrier layer. An i-line photoresist is coated on the substrate and fills the vias. An e-beam curing step is performed to render the photoresist components inactive towards adjacent layers. The photoresist is etched back to a level about 1600 Angstroms above the via bottom to form a plug. A second curing step may be performed and then a Deep UV resist is preferably coated and patterned to form a trench opening above the vias. There is no interaction between the Deep UV photoresist and the cured plug which thereby prevents scum or bridging defects from occurring. Fences during trench etch are avoided. Plug stabilization also prevents voids from forming during trench patterning.

30 Claims, 7 Drawing Sheets

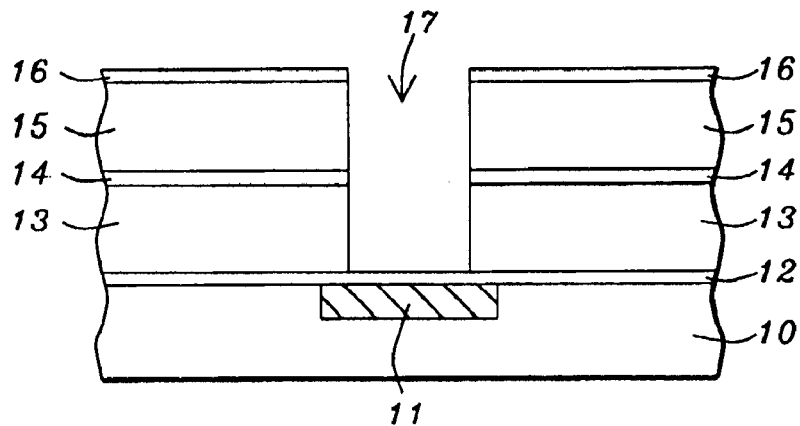
FIG. 1a - Prior Art
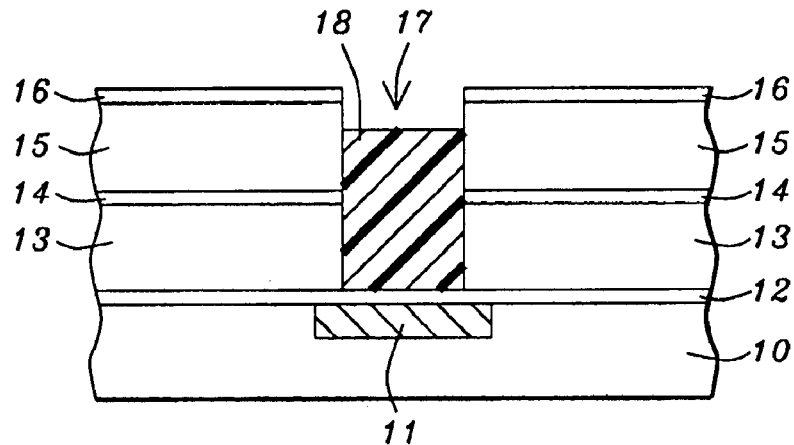
FIG. 1b - Prior Art
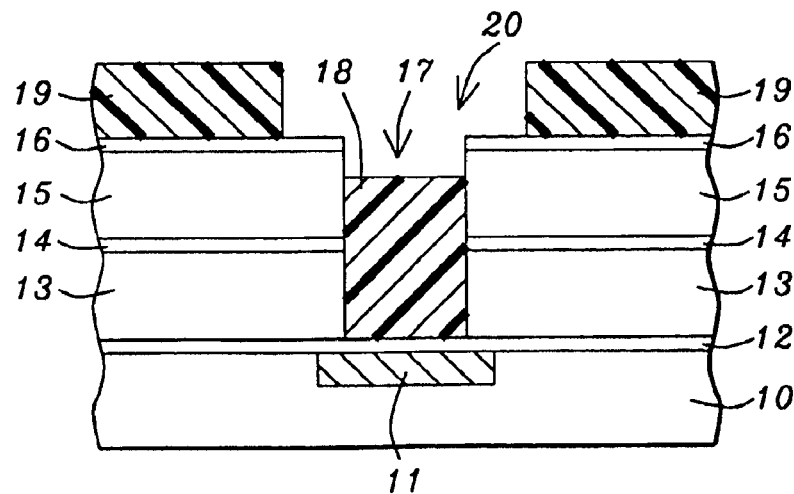
FIG. 1c - Prior Art

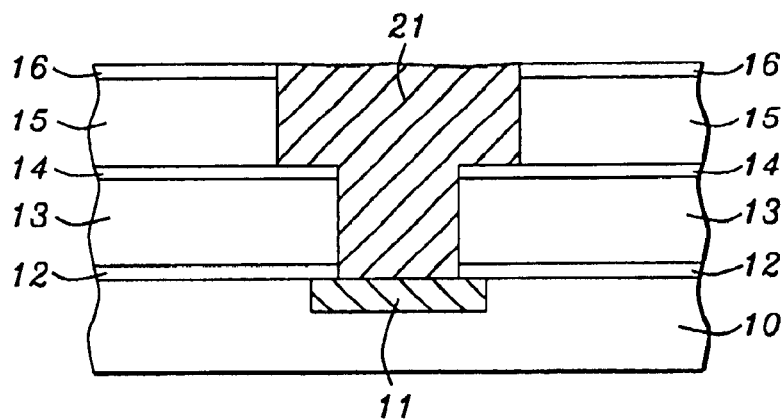
FIG. 1d - Prior Art
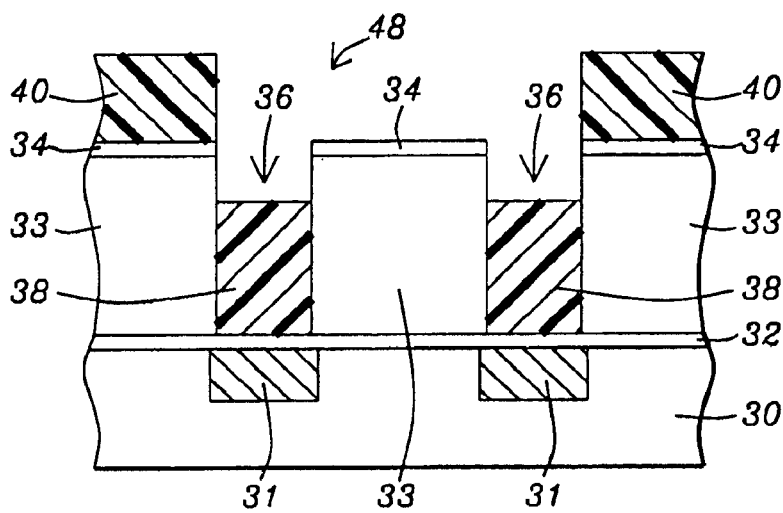
FIG. 2a - Prior Art
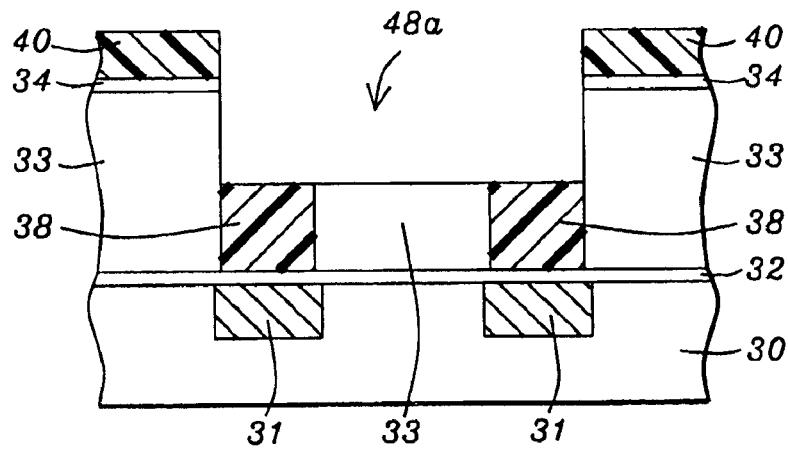
FIG. 2b - Prior Art

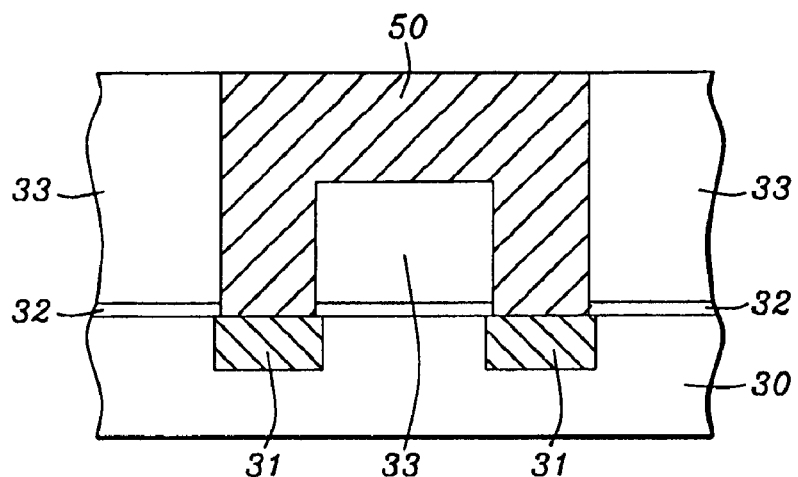
FIG. 2c – Prior Art
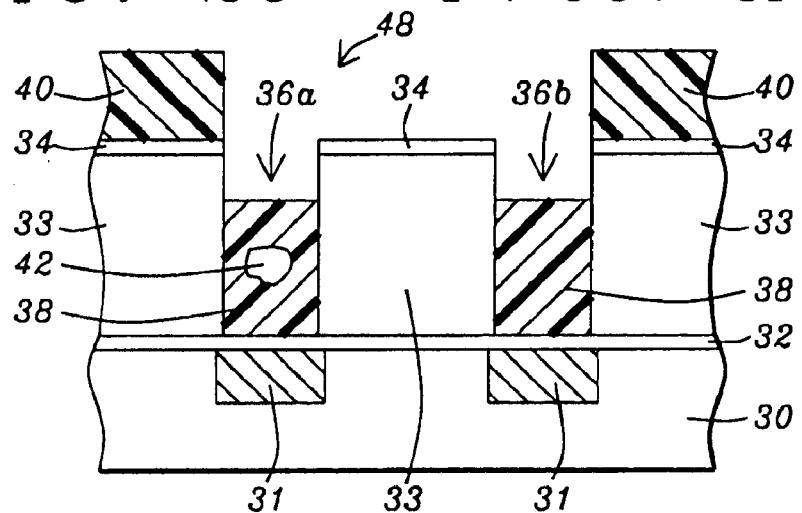
FIG. 3
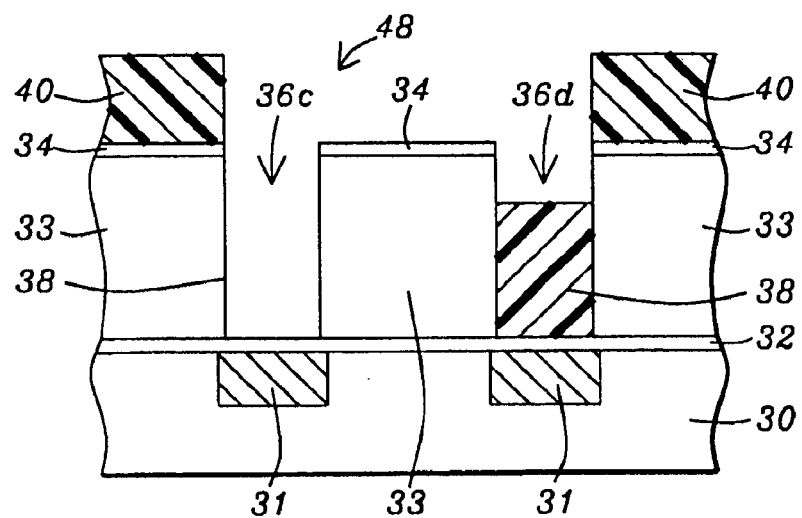
FIG. 4

PHOTORESIST SCUM FREE PROCESS FOR VIA FIRST DUAL DAMASCENE PROCESS

FIELD OF THE INVENTION

The invention relates to the field of fabricating integrated circuits and other electronic devices and in particular to an improved method of photoresist patterning that provides a scum free process during the formation of dual damascene structures.

BACKGROUND OF THE INVENTION

The manufacture of integrated circuits in a semiconductor device involves the sequential deposition of layers in which patterns are formed. Normally, a photoresist is exposed to form a pattern which is then etch transferred into an underlying layer. In back end of line (BEOL) processing, patterns consisting of trenches and via holes are filled with a conductive material to form interconnects comprised of horizontal connections within a layer and vertical connections between two layers. Conductive materials used in the interconnects are separated by insulating or dielectric materials to prevent crosstalk between the metal wiring. A popular method of manufacturing metal interconnects is a dual damascene structure in which vias and trenches are filled simultaneously with metal in an efficient, high yield process.

There is a constant focus on reducing the size of metal interconnects in order to provide devices with higher performance. Recent achievements have focused on lowering the resistivity of the conductive metal by switching from aluminum to copper, decreasing the size of the vias and trenches with improved lithographic materials and processes, and reducing the dielectric constant of insulating materials to avoid capacitive coupling between conductive lines.

The lithography method used to define a pattern in a dual damascene structure has unique challenges, especially when forming a trench in a via first process. For example, when forming a trench in a dual damascene structure, the photoresist process must contend with considerable topography since an opening on a level surface is produced at the same time as removing exposed photoresist inside a hole below the trench level.

The lithographic process is further complicated by an ever present demand for smaller trench widths which in turn require a more precise alignment over the via holes. From a photoresist standpoint, a smaller critical dimension (CD) in a feature such as a trench is more easily printed when the film thickness is reduced or the exposure wavelength is decreased according to the equation $R=k\lambda/NA$. R is the minimum CD that can be resolved while k is a process constant, $\lambda$ is the exposure wavelength, and NA is the numerical aperture of the exposure tool. Thinner films help to lower k but when forming a trench over a via hole in a dual damascene process, a thin photoresist film is not effective because it is difficult to dean out the via hole while controlling the width of the trench above the via.

One concept that has been introduced in an attempt to overcome the topography issue is to partially fill the via hole with a photoresist plug. A prior art method including a photoresist plug is illustrated in FIGS. 1a–1d which are cross-sectional views of a dual damascene structure during its fabrication. A substrate 10 is provided in which a conductive layer 11 has been formed. A barrier layer 12 such as silicon nitride, a dielectric layer 13 comprised of a material like $SiO_2$, and an etch stop layer 14 consisting of a carbide, oxide, or nitride are sequentially deposited on substrate 10. Then a second dielectric layer 15 and a second etch stop layer 16 are formed above first etch stop 14. A photoresist layer (not shown) is coated and patterned on etch stop layer 16 and then a plasma etch step is used to form via hole 17 in FIG. 1a. After the initial photoresist layer is removed, a second photoresist 18 is spin coated on etch stop 16 and then etched back until the level of photoresist 18 is below the top of via hole 17 and thereby forms a plug as shown in FIG. 1b.

Next photoresist 19 is coated on etch stop 16 and is patterned to form a trench opening 20 that is above via 17 as depicted in FIG. 1c. The trench opening 20 is etch transferred through exposed etch stop 16 and through dielectric layer 15. The top portion of photoresist plug 18 is also etched away. The final steps of photoresist removal, deposition of metal 21, and a chemical mechanical polish (CMP) step are used to complete the dual damascene structure shown in FIG. 1d. One concern with this approach is that photoresist residue or scum may result when plug 18 is not inert and interacts with photoresist 19. The scum typically occurs at the interface of photoresist 19 and plug 18 and must be removed since it will interfere with a subsequent etch step. Usually, an expensive rework process in which the entire photoresist layer 19 is stripped, recoated, and patterned again to form trench 20 is necessary.

Another dual damascene method involving formation of a trench above two via holes that is shown in FIGS. 2a–2c also has problems associated with a photoresist plug. A substrate 30 is provided in which conductive lines 31 have been formed. A barrier layer 32, dielectric layer 33 such as $SiO_2$, and etch stop layer 34 such as a nitride, oxide or carbide are deposited on substrate 30. Via holes 36 are formed according to a conventional method and are then filled with a photoresist 38 that is etched back to a level below the top of via holes 36. A second photoresist 40 is then coated and patterned on etch stop layer 34.

In some cases as shown in FIG. 5, an interaction between photoresist 40 and photoresist plug 38 causes a bridge 40a to be formed. Photoresist 40 consists of a positive tone composition in which the exposed regions are washed away in an aqueous base developer or a negative tone composition where unexposed regions are removed with aqueous base developer. In either case, a bridge 40a forms because a reaction occurs in which some of the material in photoresist 40 remains insoluble in developer. Then a subsequent etch process cannot complete the opening of the trench 48a shown in FIG. 2b. An expensive rework process is necessary to recycle the substrate and repeat the photoresist patterning step such that a successful etch transfer step can be accomplished.

Once trench 48a is formed, photoresist plug 38 and photoresist layer 40 are removed. Metal deposition of layer 50 and planarization completes the dual damascene structure shown in FIG. 2c. Although the photoresist plug 38 can be treated with high temperature to render it inactive, this step causes problems later when an etch step to remove the plug results in an ash that remains on the via bottom and induces a metal open issue in the resulting device.

Another problem associated with the dual damascene approach shown in FIGS. 2a–2c is a tendency for a void 42 to form in via hole 36a as depicted in FIG. 3. A void can form when the photoresist plug 38 is not completely inert and further reacts during the trench patterning step. The photoresist plug 38 may react to expel a gas which leaves a void or some of the aqueous base developer may remove a portion of plug 38 if the developer can penetrate the surface of the layer. The presence of a void 42 in plug 38 can affect the trench etch process such that there is an insufficient thickness of plug 38 to protect the bottom of via 36. For example, the etch transfer of trench 48 in photoresist 40 into dielectric layer 33 to form trench 48a may also penetrate through a void 42 in plug 38 to reach the bottom of via 36a and cause damage to barrier layer 32 and underlying metal layer 31.

Still another difficulty with the damascene patterning method shown in FIGS. 2a–2c is a tendency for the photoresist plug 38 to be completely removed during the trench patterning process as shown in FIG. 4. With no plug 38 in place to protect the bottom of via 36c during etch transfer of trench 48 into dielectric layer 33 to produce trench 48a, the barrier layer 32 and underlying conductive layer 31 can be damaged and a loss in device performance will result.

U.S. Pat. No. 6,211,068 describes an alternate method for applying a photoresist plug in a making a trench in a dual damascene structure. This approach is claimed to solve an interaction between the photoresist plug and surrounding dielectric layer that leads to incomplete removal of dielectric layer during the etch transfer step. The suggested solution is to etch back the level of the plug so that it is below the level of the intended trench in the dielectric layer. An interaction between the photoresist plug and dielectric material is thereby avoided during the etch transfer. However, the photoresist layer that becomes a plug is also used to form the trench opening above the damascene stack. It is difficult to control the exposure of photoresist within the via hole and simultaneously control trench formation within a tight space width specification. As a result, the process window is usually small and photoresist residue is likely to form within the via hole.

An improved method of photoresist patterning is mentioned in U.S. Pat. No. 6,156,640 in which an anti-reflective layer comprised of an oxynitride is formed as the top layer in a damascene stack and enables a larger process window when forming a trench opening in the photoresist layer. The method is a trench first process and forming the via hole second is more challenging since the hole must be printed in a thicker resist layer than a via first technique.

A dual damascene structure is described in U.S. Pat. No. 5,933,761 in which ion implant steps are employed to form etch stop layers within a dielectric layer. Implanting nitrogen or nitrogen ions to a controlled depth becomes especially challenging as the width of trenches and via holes approaches 100 nm to 130 nm sizes needed for the most recent technology generations. The method also requires photoresist patterning over considerable topography which can reduce the lithographic process window.

Another fabrication method for a dual damascene structure is described in U.S. Pat. No. 6,319,820 where electron beam (e-beam) curing is conducted on a hydrogenated silsesquioxane (HSQ) dielectric layer in order to impart a higher etch selectivity. Because the uncured HSQ regions undergo a faster etch than cured regions, a wet etch process can be applied to form a trench and via hole. Here it is understood that the electrons in the curing step transform the HSQ into a denser and more rigid structure. However, the process involves a dose of 1000 to 10000 microCoulombs/$cm^2$ and a substrate temperature in the range of 3000° C. to 500° C. which is not compatible with some dielectric materials.

Therefore, an improved patterning method for forming trenches in via first dual damascene processes is desirable. A photoresist plug has an advantage in enabling a larger process window when patterning an overlying photoresist to form a trench pattern. However, the plug must be rendered inactive so that it does not interact with the overlying photoresist to cause void or bridging defects. In addition the plug should not interact with an adjacent dielectric material to cause fences during the trench etch transfer. The procedure that makes the plug inactive toward adjacent layers must not interfere with plug removal at a later stage since ash residue in the via hole can result in metal opens which are incomplete connections in the final device.

SUMMARY OF THE INVENTION

An objective of the present invention is to provide an improved method of forming dual damascene structures with a photoresist patterning process that is resistant to scum in via holes when forming trenches.

A further objective of the present invention is to provide a method of treating a plug in a via hole such that it does not form voids or become dislodged during the trench patterning of an overlying photoresist.

A still further objective of the present invention is to provide a method of treating a plug in a via hole to make it inactive toward an adjacent dielectric layer and avoid fences that are formed when dielectric material is not removed during trench etch because it has reacted with the via plug.

These objectives are achieved by implementing a curing treatment of a photoresist plug prior to coating an overlying photoresist that is patterned to form a trench. A substrate is provided upon which a damascene stack has been formed. Within the substrate are conductive regions separated by dielectric material. The damascene stack has been formed by sequentially depositing a barrier layer of silicon nitride, a dielectric layer, and an etch (CMP) stop layer. Via holes that extend through the etch stop and dielectric layers are formed by conventional patterning and etching steps and are aligned above the conductive regions in the substrate.

An i-line photoresist which is sensitive to 365 nm radiation is coated to a thickness of about 7200 Angstroms above the damascene stack and also fills the via hole. At this point the substrate is subjected to an e-beam treatment in which the photoresist is cured with a dose between 1000 and 20000 microCoulombs/$Cm^2$. The substrate can also be heated to a temperature of 100° C. to about 150° C. during the curing. The e-beam treatment exposes all of the photosensitive components and renders them inactive toward further exposure from electrons or photons. The curing is also believed to crosslink the polymer component of the photoresist so that it will be immiscible with photoresist that is coated upon it. The level of i-line photoresist is lowered by an etch process until a thickness of 1600±500 Angstroms remains above the silicon nitride in the via hole. This remaining photoresist is called a plug that will protect the bottom of the via during a subsequent trench etch step. The plug also serves to planarize the topography so that an overlying photoresist does not have to fill a deep via hole during trench patterning.

Optionally, a second e-beam cure can be performed at this point to ensure that the curing of the plug is complete within the via hole. Then a second photoresist is spin coated on the substrate to give a thickness of about 6200 Angstroms above the second etch stop layer. The second photoresist also fills the via hole and this material can be either a positive or negative tone composition but is preferably Deep UV (248 nm) sensitive in order to form a trench opening with a CD requirement of 0.22 microns+/−0.022 microns. Deep UV photoresist is generally preferred to form trench openings having a width between about 0.13 microns and 0.30 microns. After the Deep UV photoresist is exposed, post-expose baked, and developed in aqueous base, a scum free trench opening is produced. The opening is etch transferred through the etch stop layer and into the dielectric layer. Some of the photoresist plug is also removed by the etchant. Since the plug is rendered inactive towards the adjacent dielectric layer during the curing steps, there is no fence formed during the etch transfer and a wide process window is realized for the trench etch. The remaining DUV photoresist and the photoresist plug are removed and then the damascene structure is completed by depositing metal in the via hole and trench and planarizing with a CMP step.

In a second embodiment, the curing steps are performed with a UV exposure tool such as a blanket exposure tool that produces a broad band of wavelengths in the range of about 200 nm to about 600 nm and does not have overlay capability or stage movement that enables a pattern to be repeatedly exposed across the substrate. This method is low cost because it does not require expensive steppers or scanners required for printing fine patterns in photoresist layers.

BRIEF DESCRIPTION OF THE DRAWINGS

FIGS. 1a–1d are cross-sectional views depicting a prior art method of forming a dual damascene structure.

FIGS. 2a–2c are cross-sectional views illustrating a prior art method for forming a dual damascene structure.

FIGS. 3–5 are cross-sectional views showing defects that can occur during formation of a trench pattern in a process outlined in FIGS. 2a–2c.

DETAILED DESCRIPTION OF THE INVENTION

Figure 6A:
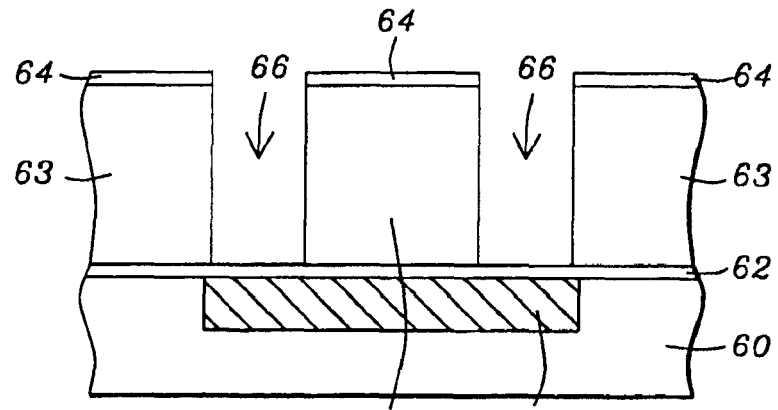
FIGS. 6a–6f are cross-sectional views depicting a dual damascene process according to an embodiment of the present invention.
Figure 6B:
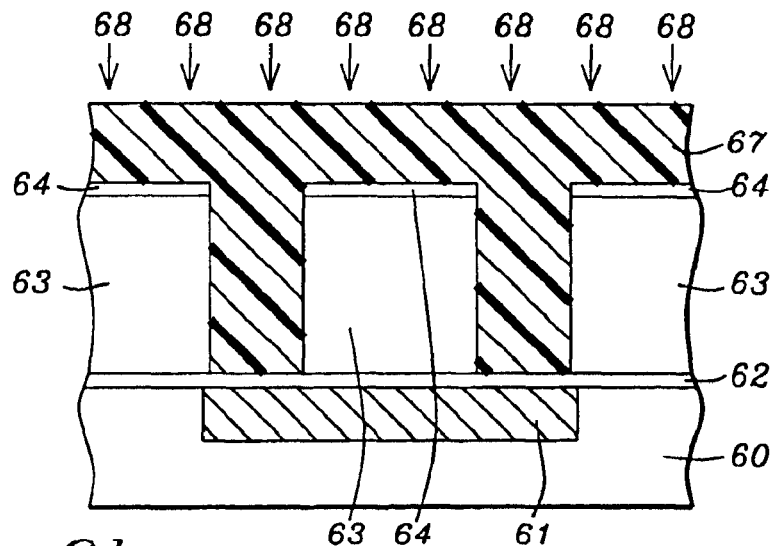

The present invention is particularly useful for photoresist patterning to form a trench in a via first dual damascene process and etch transferring the pattern into an underlying dielectric layer. The first embodiment is illustrated in FIGS. 6a–6f. Referring to FIG. 6a, a substrate 60 containing a conductive layer 61 is provided. Conductive layer 61 is normally connected to underlying wiring through a contact hole which is not shown here in order to simplify the drawing. Conductive layer 61 is adjacent to insulating material which is also not shown but separates the conductive material from nearby wiring in the horizontal direction. A barrier layer 62 comprised of silicon nitride is deposited by a chemical vapor deposition (CVD) technique on conductive material 61. The thickness of barrier layer 62 is normally in the range of about 200 to about 600 Angstroms. Next a dielectric layer 63 typically comprised of $SiO_2$ or a low k dielectric material such as fluorosilicate glass, porous $SiO_2$, organic doped $SiO_2$, polyimide, SiLK from Dow Corning, or FLARE from Allied Signal is deposited to a thickness of between 4000 and 9000 Angstroms on barrier layer 62. The top layer of the damascene stack which is etch stop 64 consists of a carbide, nitride, oxide, or oxynitride layer that functions as an etch stop during a subsequent chemical mechanical polish (CMP) step.

Via holes 66 are then formed in the etch stop layer 64 and dielectric layer 63 by a conventional photoresist patterning process (not shown) followed by etch transfer of the via opening through the underlying layers 63, 64. The via holes 66 are aligned above conductive layer 61. At this point, an i-line photoresist is spin coated to form a photoresist layer 67 with a thickness of about 7200 Angstroms on the etch stop layer 64 and also fills via holes 66. When the photoresist layer 67 has a positive tone composition, it includes a photosensitive compound and a Novolac resin that is typically produced from cresol and formaldehyde. A key feature of the invention is an electron beam (e-beam) curing 68 of the photoresist layer 67 with an exposure dose of from 1000 to 20000 microCoulombs/cm$^2$ and an accelerating voltage of about 1 to 10 keV. Substrate 60 may also be heated at a temperature between 100° C. and 150° C. during the e-beam treatment 68 illustrated in FIG. 6b. The e-beam exposure 68 converts all of the photosensitive component in the photoresist layer 67 to an inactive material and is also believed to crosslink the Novolac resin so that transformed photoresist layer 67a becomes immiscible with other organic layers that are coated upon it.

If the photoresist layer 67 has a negative tone composition, it is comprised of a phenolic resin, a crosslinking component, and a photosensitive material. In this case the e-beam curing will convert all of the photosensitive ingredient into a material that is inactive towards further radiation or heat. The e-beam exposure in combination with heat will cause the phenolic resin and crosslinker to form a crosslinked network that becomes immiscible with other photoresists that are coated upon it and unreactive toward adjacent dielectric layers. The curing method is equally effective whether the photoresist is positive tone or negative tone.

Figure 6C:
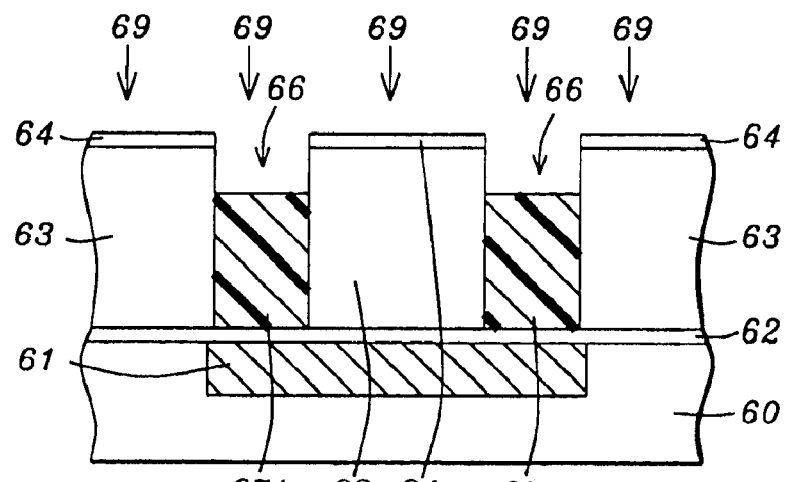
Figure 6D:
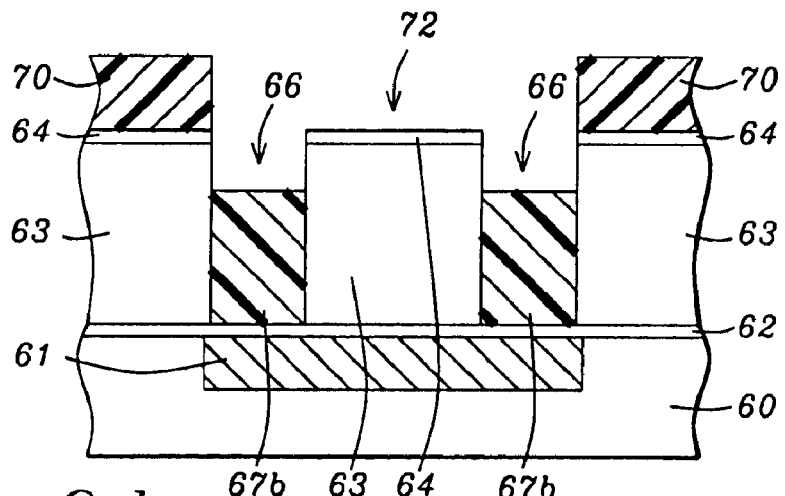

Next transformed photoresist layer 67a is etched back to a level that is about 1600±500 Angstroms above the silicon nitride barrier layer 62 at the bottom of via holes 66. Transformed photoresist layer 67a as depicted in FIG. 6c will hereafter be referred to as photoresist plug 67a and is useful in protecting the bottom of via holes 66 during a later trench etch step. At this point, the electron beam curing treatment described earlier may be repeated as indicated by e-beam exposure 69 in FIG. 6c to ensure that the components in photoresist plug 67a are totally inactive toward adjacent dielectric layer 63 and will not react with any photoresist layer that is coated over the plug. Substrate 60 may be heated at a temperature between 100° C. and 150° C. during the e-beam treatment 69. Photoresist plug 67a is now designated as plug 67b to indicate transformation of any remaining traces of active components into inactive materials by the second e-beam curing.

A Deep UV (248 nm sensitive) photoresist is then spin coated on the etch stop layer 64 and is baked to form a photoresist layer 70 with a thickness of about 6200 Angstroms. A Deep UV photoresist 70 layer is necessary for forming a trench opening 72 in order to meet the trench width requirement of 0.22 microns+0.022 in this example. In general, a Deep UV photoresist is preferred for forming openings in the range of about 0.13 microns to around 0.30 microns. However, this method is also applicable to printing smaller openings of ≦0.13 microns in width in which case a 193 nm sensitive photoresist is preferably used. Photoresist layer 70 also fills via holes 66 above the level of photoresist plug 67b. After the photoresist layer 70 is exposed, post-expose baked, and developed in an aqueous base developer, a trench opening 72 is formed which is aligned over the conductive layer 61 in substrate 60. Since there is no interaction between the photoresist layer 70 and plug 67b because of the previous e-beam curing steps, scum or photoresist residue in via holes 66 is avoided and there is no bridging between photoresist layers as shown in related art FIG. 5. Moreover, the stabilized plug 67b does not form voids as in related art FIG. 3 and does not become dislodged as in related art FIG. 4.

Figure 6E:
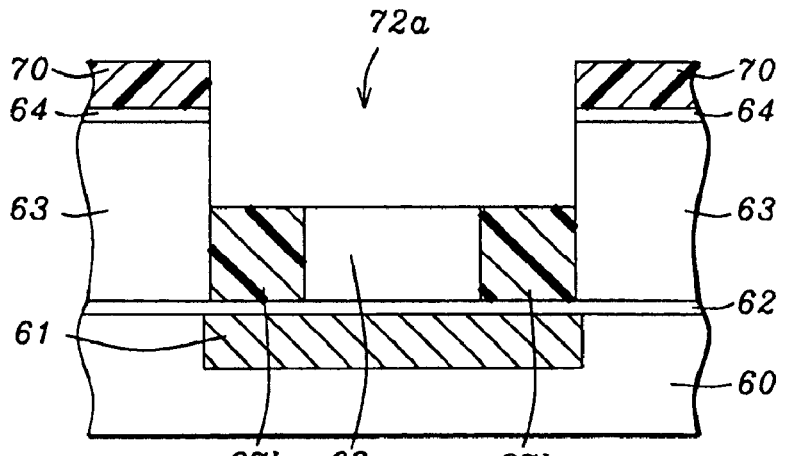

Trench opening 72 is etch transferred through exposed etch stop layer 64 and through the top portion of exposed dielectric layer 63. The etch is timed to stop at a predetermined distance of approximately 3500 Angstroms above barrier layer 62. Those skilled in the art are familiar with the etch processes required for this step and the details are not provided here. Photoresist plug 67b is also partially removed during the etch such that plug 67b is now coplanar with the top of dielectric layer 63 at the bottom of trench 72a as shown in FIG. 6e. In addition, photoresist layer 70 is partially removed by the etch transfer step. Next photoresist layer 70 and plug 67b are stripped by a process which involves $O_2$ or $H_2$ plasma. The stripping step is usually followed by a standard cleaning to ensure that all organic residues are removed.

Figure 6F:
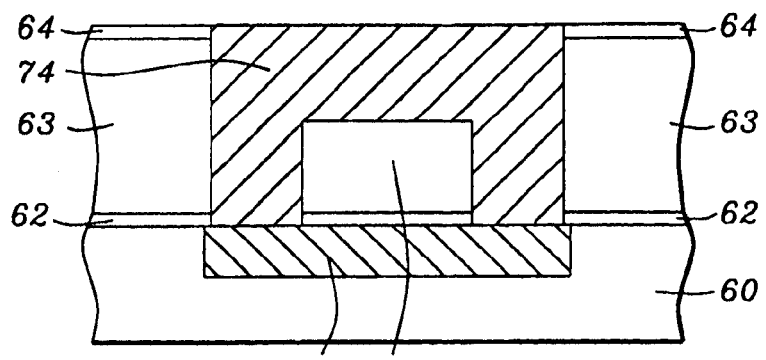

The final sequence in forming the dual damascene structure depicted in FIG. 6f is to deposit a metal layer 74 which simultaneously fills via holes 66 and trench 72a. The surface of the metal layer 74 which is typically copper, aluminum, or an Al/Cu alloy is planarized with a CMP technique so that the top of the metal layer 74 is coplanar with the top of etch stop layer 64. Optionally, a liner such as TiN, TaN, TaSiN, or WN may be deposited on the sidewalls and base of the trench 72a and via holes 66 before the metal is deposited.

This embodiment has an advantage over prior art in that defects such as scum, bridging, and voids are eliminated because the photoresist plug is rendered inactive during the e-beam curing. High temperatures above 150° C. are avoided during the curing and this enables the photoresist plug to be stripped after the trench etch transfer without forming an ash that is difficult to remove. An interaction between the photoresist plug and adjacent dielectric layer is also avoided. This allows the trench etch transfer to proceed without forming undesirable fences that require expensive rework to remove.

A second embodiment of the present invention is set forth in FIGS. 7a–7e. The design in which one damascene structure has two via holes and one trench aligned over one conductive layer while an adjacent damascene structure has only one via hole and one trench aligned over a conductive layer could also apply to the first embodiment. In the second embodiment, the width of the drawing has been expanded in order to show two damascene structures rather than just one as in FIGS. 6a–6f. The drawings are intended as examples and not as limiting the scope of the invention.

Figure 7A:
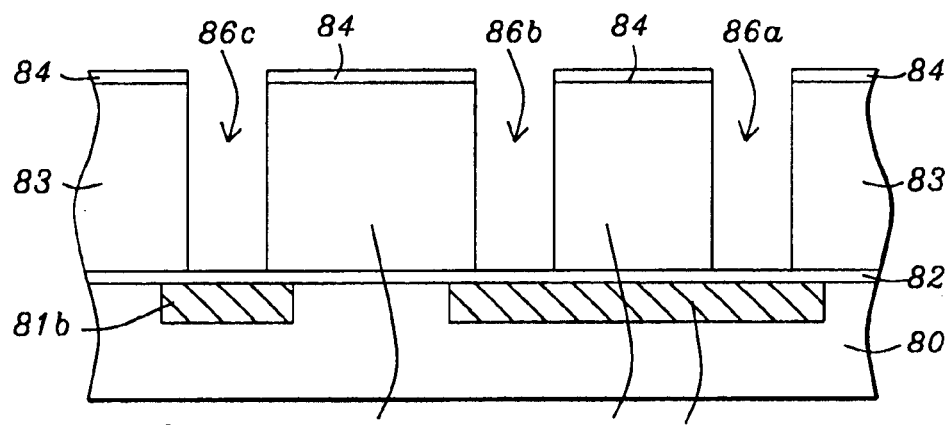
FIGS. 7a–7e are cross-sectional views representing a dual damascene process according to a second embodiment of the present invention.

Referring to FIG. 7a, a substrate 80 containing conductive layers 81a and 81b is provided. Conductive layers 81a and 81b are comprised of a metal such as copper or aluminum or a metal silicide and are normally connected to underlying wiring through a contact hole which is not shown here in order to simplify the drawing. Conductive layers 81a and 81b are separated by insulating material which is also not shown in substrate 80. A barrier layer 82 comprised of silicon nitride is deposited by a chemical vapor deposition (CVD) technique on conductive layers 81a and 81b. The thickness of barrier layer 82 is normally in the range of about 200 to about 600 Angstroms. Next a dielectric layer 83 such as $SiO_2$ or a low k dielectric material such as fluorosilicate glass, porous $SiO_2$, organic doped $SiO_2$, polyimide, SiLK from Dow Corning, or FLARE from Allied Signal is deposited to a thickness of between about 4000 and 9000 Angstroms on barrier layer 82. The top layer of the damascene stack which is etch stop 84 consists of a carbide, nitride, oxide, or oxynitride layer that functions as an etch stop during a subsequent CMP step. Etch stop 84 is between about 300 and 1200 Angstroms thick.

Via holes 86a, 86b, and 86c are then formed in etch stop layer 84 and in dielectric layer 83 by a conventional photoresist patterning process (not shown) followed by etch transfer of the via openings through the dielectric layer 83 and etch stop layer 84. Those skilled in the art are familiar with the via patterning and etch transfer processes and the details are not described herein. Via holes 86a, 86b are aligned above the conductive layer 81a and via hole 86c is aligned above the conductive layer 81b.

Figure 7B:
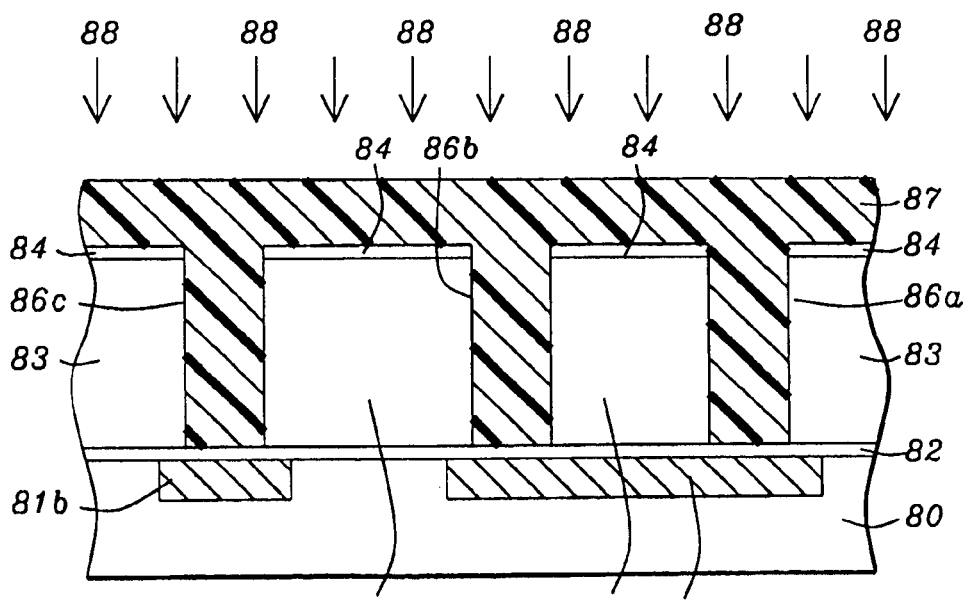
Figure 7C:
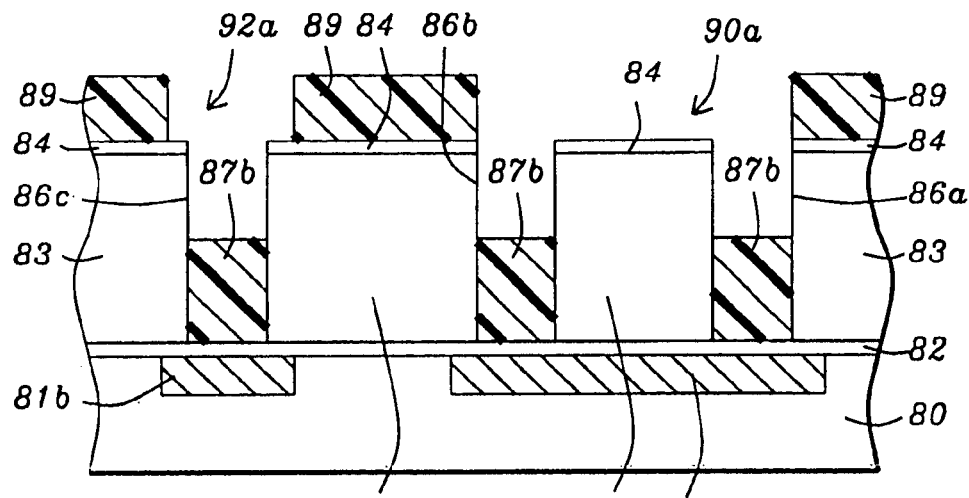

At this point, an i-line photoresist is spin coated to form a photoresist layer 87 with a thickness of about 7200 Angstroms on etch stop layer 84 and also fills via holes 86a, 86b, and 86c. When the photoresist layer 87 has a positive tone composition, it includes a photosensitive compound and a Novolac resin that is typically produced from cresol and formaldehyde. A key feature of this embodiment is a curing step with ultraviolet (UV) radiation from, a source such as a UV broadband flood exposure tool with a wavelength output in the range of about 200 nm to about 600 nm. The UV curing tool is relatively inexpensive since it does not have overlay capability or stage movement that enables a pattern to be repeatedly exposed across the substrate. Curing step 88 of the photoresist layer 87 in FIG. 7b is performed with an exposure dose that is sufficient to render the photoresist 87 layer inactive. Those skilled in the art are familiar with the infrared and thermal characterization methods that can be employed to determine a proper dose. Substrate 80 is also heated at a temperature between 150° C. and 250° C. during the UV curing step 88 in order to increase the rate of curing. The UV curing step 88 converts the entire photosensitive component in the photoresist layer 87 to an inactive material. The heat combined with the UV curing step 88 crosslinks the Novolac resin so that transformed photoresist layer 87a becomes immiscible with other organic layers that are coated upon it.

If photoresist 87 has a negative tone composition, it is comprised of a phenolic resin, a crosslinking component, and a photosensitive material. In this case the UV curing will convert all of the photosensitive ingredient into a material that is inactive towards further radiation or heat. The UV exposure in combination with heat will cause the phenolic resin and crosslinker to form a crosslinked network that becomes immiscible with other photoresists that are coated upon it and unreactive toward adjacent dielectric layers. The curing method is equally effective whether the photoresist is positive tone or negative tone.

Next transformed photoresist layer 87a (not shown) is etched back to a level that is about 1600±500 Angstroms above the silicon nitride barrier layer 82 at the bottom of via holes 86a, 86b, and 86c. Transformed photoresist layers 87a will hereafter be referred to as photoresist plugs 87a and are useful in protecting the bottom of via holes 86a, 86b, and 86c during a later trench etch step. At this point, the UV curing step described earlier may be repeated to ensure that the components in photoresist plugs 87a are totally inactive toward adjacent dielectric layer 83 and will not react with any photoresist layer that is coated over the plug. The dose for the optional second UV curing step (not shown) is equal to or less than the dose for the first UV curing step and substrate 80 is heated at a temperature between 150° C. and 250° C. during the second UV transformation of any remaining traces of active components into inactive materials by the second UV curing step.

Figure 5:
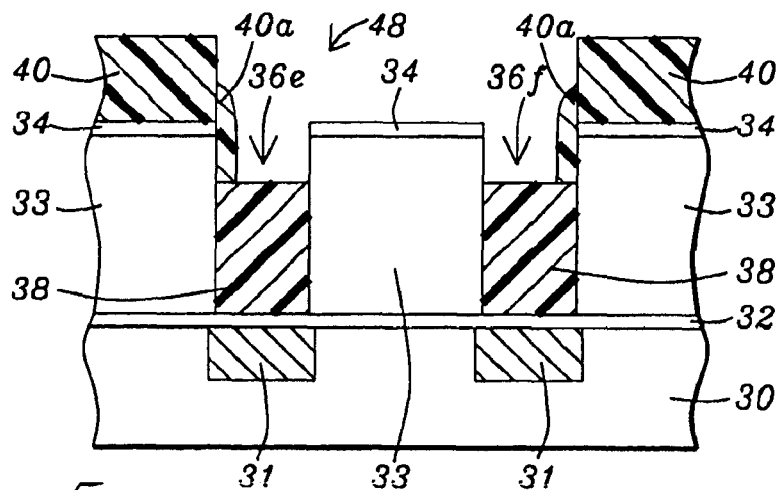

A Deep UV (248 nm sensitive) photoresist is then spin coated on etch stop layer 84 and is baked to form a photoresist layer 89 with a thickness of about 6200 Angstroms. A Deep UV photoresist 89 is necessary for forming a trench opening 92a in order to meet the trench width requirement of 0.22 microns+0.022 in this example. In general, a Deep UV photoresist is preferred for forming openings in the range of about 0.13 microns to around 0.30 microns. However, this method is also applicable to printing smaller openings of ≦0.13 microns in width in which case a 193 nm sensitive photoresist is preferably used. Photoresist layer 89 also fills via holes 86a, 86b, and 86c above the level of photoresist plugs 87b. After the photoresist layer 89 is exposed, post-expose baked, and developed in an aqueous base developer, trench openings 90a and 92a are formed and are aligned over conductive layers 81a and 81b, respectively, in substrate 80. Since there is no interaction between the photoresist layer 89 and plugs 87b because of the previous UV curing steps, scum or photoresist residue in via holes 86a, 86b, and 86c is avoided and there is no bridging between photoresist layers as shown in FIG. 5. Moreover, the stabilized plugs 87b do not contain voids and do not become dislodged as in FIG. 4.

Figure 7D:
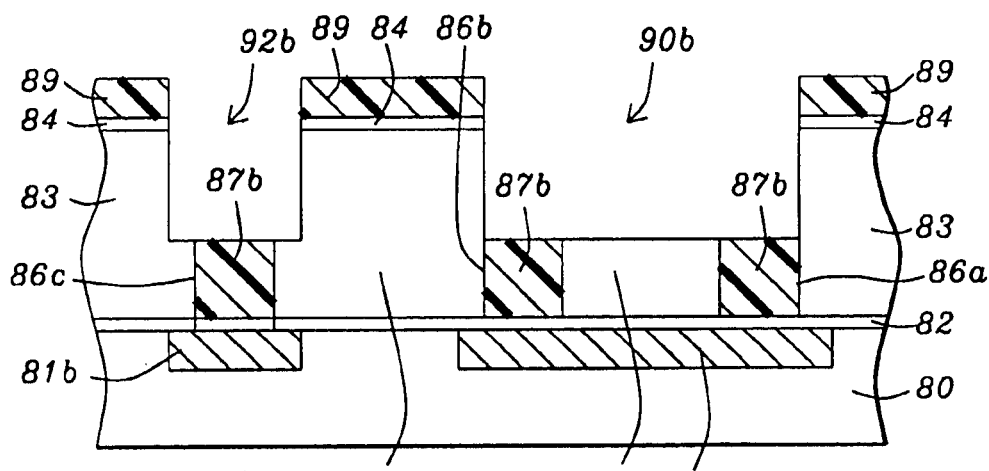
Figure 7E:
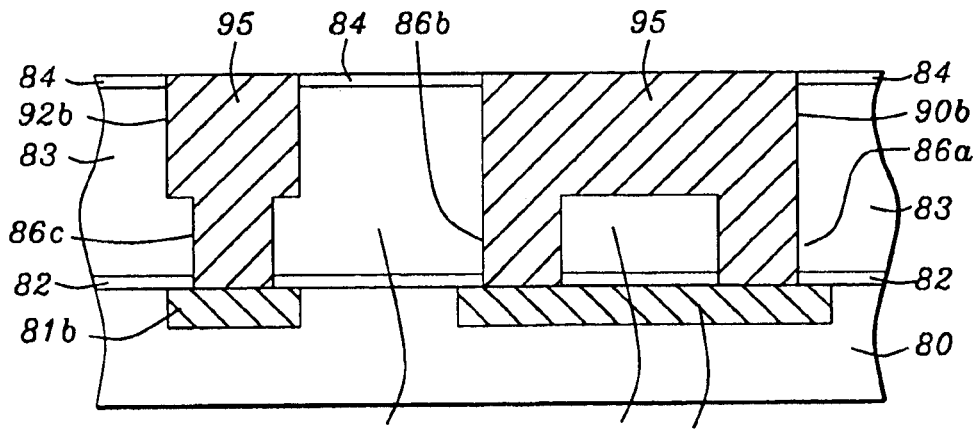

Trench openings 90a and 92a are etch transferred through exposed etch stop layer 84 and through the top portion of exposed dielectric layer 83 to yield trenches 90b and 92b. The etch is timed to stop at a predetermined distance of approximately 3500 Angstroms above barrier layer 82. Those skilled in the art are familiar with the etch processes required for this step and the details are not provided here. Photoresist plugs 87b are partially removed during the etch such that plug 87b is now coplanar with dielectric layer 83 at the bottom of trenches 90a and 92a as shown in FIG. 7d. In addition, the photoresist layer 89 is partially removed by the etch transfer step. Next the photoresist layer 89 and plugs 87b are stripped by $O_2$ or $H_2$ plasma. The stripping step is usually followed by a standard cleaning to ensure that all organic residues are removed The final sequence in forming the dual damascene structure depicted in FIG. 7e is to deposit a metal layer 95 which simultaneously fills via holes 86a, 86b, and 86c and trenches 90b and 92b. The surface of the metal layer 95 which is typically copper, aluminum, or an Al/Cu alloy is planarized with a CMP technique so that the top of the metal layer 95 is coplanar with the top of etch stop layer 84. Optionally, a liner such as TiN, TaN, TaSiN, or WN may be deposited to form a liner on the sidewalls and base of the trenches 90a and 92a and via holes 86a, 86b, and 86c before the metal layer 95 is deposited.

This embodiment has an advantage over prior art in that defects such as scum, bridging, and voids are eliminated because the photoresist plugs are rendered inactive during UV curing. High temperatures above 250° C. are avoided during the curing and this enables the photoresist plugs to be stripped after the trench etch transfer without forming an ash that is difficult to remove. An interaction between the photoresist plugs and an adjacent dielectric layer is also avoided. This allows the trench etch transfer to proceed without forming undesirable fences that require expensive rework to remove.

While this invention has been particularly shown and described with reference to, the preferred embodiments thereof, it will be understood by those skilled in the art that various changes in form and details may be made without departing from the spirit and scope of this invention.

We claim:

1. A dual damascene method comprising:
    (a) providing a substrate having one or more conductive regions and a stack of layers on said substrate;
    (b) forming at least one via hole in said stack, said via hole is aligned above a conductive region;
    (c) depositing a photoresist layer within said via hole;
    (d) curing said photoresist layer with an electron beam;
    (e) etching said photoresist layer to a level below the top of said via hole;
    (f) forming a trench above said via hole;
    (g) removing said photoresist layer from said via hole; and
    (h) filling the trench and via hole simultaneously with metal.

2. The method of claim 1 wherein said conductive regions are comprised of copper, aluminum, or a Cu/Al alloy.

3. The method of claim 1 wherein said stack of layers is comprised of an upper etch stop layer, a middle dielectric layer, and a bottom barrier layer.

4. The method of claim 3 wherein said dielectric layer has a thickness between about 4000 and 9000 Angstroms.

5. The method of claim 3 wherein said etch stop layer is comprised of a carbide, nitride, oxide or oxynitride and has a thickness in the range of about 200 to 600 Angstroms.

6. The method of claim 1 wherein said dielectric layer is selected from a group of materials including SiLK, FLARE, $SiO_2$, polyimides, fluorosilicate glass, porous $SiO_2$ and organic doped $SiO_2$.

7. The method of claim 1 wherein the exposure dose for the e-beam curing step is from about 1000 to 20000 microCoulombs/cm$^2$ with an accelerating voltage of about 1 to 10 keV.

8. The method of claim 7 further comprised of heating the substrate between about 100° C. and 150° C. during the e-beam exposure.

9. The method of claim 1 further comprising a step of e-beam curing the photoresist layer in said via hole after said etching step and prior to forming said trench.

10. The method of claim 1 wherein said photoresist layer is etched to a level that is 1600±500 Angstroms above the bottom of said via hole.

11. The method of claim 1 wherein said photoresist layer is comprised of an i-line photoresist.

12. The method of claim 1 wherein said photoresist layer is a positive tone composition.

13. The method of claim 1 wherein said photoresist layer is a negative tone composition.

14. The method of claim 1 wherein the trench pattern has a width between about 0.1 microns and 0.5 microns.

15. The method of claim 1 wherein the trench etch is stopped at a point wherein the bottom of the trench is from about 2000 to 5000 Angstroms above the bottom of said via hole.

16. A dual damascene method comprising:
    (a) providing a substrate having one or more conductive regions and a stack of layers on said substrate;
    (b) forming at least one via hole in said stack, said via hole is aligned above a conductive region;
    (c) depositing a photoresist layer within said via hole;
    (d) performing a UV curing step while heating said substrate;
    (e) etching said photoresist layer to a level below the top of said via hole;
    (f) forming a trench above said via hole;

(g) removing said photoresist layer from said via hole; and (h) filling the trench and via hole simultaneously with metal.

17. The method of claim 16 wherein said conductive region is comprised of copper, aluminum, or a Cu/Al alloy.

18. The method of claim 16 wherein said stack of layers is comprised of an upper etch stop layer, a middle dielectric layer, and a bottom barrier layer.

19. The method of claim 18 wherein said dielectric layer has a thickness from between about 4000 and 9000 Angstroms.

20. The method of claim 18 wherein said etch stop layer is comprised of a carbide, nitride, oxide or oxynitride and has a thickness in the range of about 200 to 600 Angstroms.

21. The method of claim 16 wherein said dielectric layer is selected from a group of materials including SiLK, FLARE, $SiO_2$, polyimides, fluorosilicate glass, porous $SiO_2$ and organic doped $SiO_2$.

22. The method of claim 16 wherein the exposure for the UV curing step is comprised of one or more wavelengths from a range of about 200 nm to 600 nm.

23. The method of claim 22 wherein the substrate is heated between about 150° C. and 250° C. during the UV curing step.

24. The method of claim 16 further comprising a step of UV curing the photoresist in said via hole after said etching step and prior to forming said trench.

25. The method of claim 16 wherein said photoresist layer is etched to a level that is 1600±500 Angstroms above the bottom of said via hole.

26. The method of claim 16 wherein said photoresist layer is comprised of an i-line photoresist.

27. The method of claim 16 wherein said photoresist layer is a negative tone composition.

28. The method of claim 16 wherein said photoresist layer is a positive tone composition.

29. The method of claim 16 wherein the trench pattern has a width in the range of about 0.1 microns to 0.5 microns.

30. The method of claim 16 wherein the trench etch is stopped at a point wherein the bottom of the trench is from about 2000 to 5000 Angstroms above the bottom of said via hole.

* * * * *